United States Patent [19]

Kola et al.

[11] Patent Number: 5,480,529
[45] Date of Patent: Jan. 2, 1996

[54] APPARATUS FOR DEPOSITING LOW STRESS FILMS

[75] Inventors: Ratnaji R. Kola, Berkeley Heights; Gabriel L. Miller, Westfield; Eric R. Wagner, South Plainfield, all of N.J.

[73] Assignee: AT&T Corp., Murray Hill, N.J.

[21] Appl. No.: 340,515

[22] Filed: Nov. 16, 1994

Related U.S. Application Data

[62] Division of Ser. No. 166,672, Dec. 14, 1993, Pat. No. 5,382,340, which is a continuation of Ser. No. 850,639, Mar. 13, 1992, abandoned.

[51] Int. Cl.$^6$ ................................................ C23C 14/34
[52] U.S. Cl. .................... 204/298.03; 118/665
[58] Field of Search .................. 204/192.12, 192.13, 204/192.15, 298.03; 427/65, 123, 160, 161; 118/723 R, 665, 708

[56] References Cited

U.S. PATENT DOCUMENTS 4,893,071  1/1990  Miller ..................................... 324/660

OTHER PUBLICATIONS

Miller, "Feedback . . . Semiconductors", IEEE Transactions on electron devices, vol. Ed 19, No. 10, Oct. 1972, pp. 1103–1108.

Ku et al., "Use . . . masks", J. Vac. Sci. Technol. B6(6), Nov./Dec. 1988, pp. 2174–2177.

*Primary Examiner*—Nam Nguyen
*Attorney, Agent, or Firm*—Bruce S. Schneider; Margaret A. Burke; David N. Fogg

[57] ABSTRACT

X-ray masks are typically made by depositing and patterning a layer of heavy metal on a thin supporting membrane. The metal layer must have a relatively low stress to prevent stress-induced deformation of the pattern. Tungsten films having excellent stress characteristics are produced by employing a continuously operating capacitance-based measurement technique to allow adjustment of the deposition conditions in rapid response to changes in stress of the film being deposited.

4 Claims, 2 Drawing Sheets

APPARATUS FOR DEPOSITING LOW STRESS FILMS

CROSS-REFERENCE TO RELATED APPLICATION

This is a division of application Ser. No. 08/166,672 filed Dec. 14, 1993, now U.S. Pat. No. 5,382,340, which is a continuation of Ser. No. 07/850,639 filed Mar. 13, 1992 now abandoned.

This application has been filed concurrently with U.S. patent application Ser. No. 07/850,637, pending which is hereby incorporated by reference.

BACKGROUND OF THE INVENTION

1. Field of the Invention

This invention relates to fabrication of x-ray masks and, in particular, masks including a patterned metal on a membrane.

2. Art Background

As design rules in the manufacture of devices, e.g. integrated circuits opto-electronic devices, and micro-mechanical structures, become smaller, the radiation employed for lithography, in turn, must be of a correspondingly shorter wavelength. Thus, for example, when the design rule is below 0.5μ, use of short wavelength radiation such as x-ray radiation (radiation having a wavelength typically in the range 4 to 150 Å) has been suggested.

During exposure, energy incident on a mask which defines a pattern is transmitted in this pattern to expose an underlying energy sensitive material. The energy sensitive material after this exposure is delineated into the pattern by development and employed in the manufacture of the desired device. For x-ray exposure, the mask is generally a membrane stretched across a supporting structure, for example, a ring with a region patterned in a metal coating the membrane surface. Typically, the membrane is a material such as Si, $SiN_x$ (x is typically between 1 and 1.3) or SiC, and has a thickness generally in the range 0.1 to 4 μm.

Since the membranes must be quite thin to avoid excessive attenuation of incident energy, substantial stress, i.e. stress greater than 50 MPa, imposed on the membrane from the overlying metal pattern is unacceptable because it causes unacceptable distortion of the pattern. The requirement of limited stress, in turn, imposes substantial limitations on the process of forming the overlying metal pattern.

In a typical mask fabrication procedure, a layer of metal is deposited on a membrane such as by sputtering. A pattern in polymeric material is formed over the metal layer, and the metal regions not covered by the polymeric material are removed by etching. Subsequent removal of the overlying polymeric material leaves a patterned metal overlying the membrane.

Various materials have been suggested for use in the metal layer. Although gold is relatively easy to deposit, its presence in device manufacturing environments and in particular, integrated circuit manufacturing environments, is not preferred. Gold impurities, even in extremely small mounts, introduced into an integrated circuit often substantially degrade the properties and reliability of the device. Stress in gold films is also known to change with time, even at room temperature. Recent studies indicate that at temperatures above 70° C., stresses increase rapidly. Therefore, materials other than gold have been investigated.

One alternative to gold is tungsten. Although tungsten is considered compatible with an integrated circuit manufacturing environment, tungsten films deposited on a membrane generally induce substantial compressive or tensile stress that ultimately distorts the required pattern or even produces membrane failure. Various attempts have been made to reduce the stress associated with the deposition of tungsten. For example, as described by Y. C. Ku et al, *Journal of Vacuum Science & Technology*, B9, 3297 (1991), a monitoring method is employed for determining stress in the tungsten being deposited. This monitoring method is based on the resonant frequency f of a circular diaphragm of the composite structure which, in turn, is related to the stress by the equation:

$$f = \frac{1}{2.61\, r} \left\{ \frac{\sigma_m t_m + \sigma_f t_f}{\rho_m t_m + \rho_f t_f} \right\}^{1/2}, \quad (1)$$

where r is the radius of the membrane, $\sigma_m$, $\rho_m$, and $t_m$ are stress, density, and thickness of the membrane respectively, and the corresponding terms such as $\sigma_f$ are stress, density, and thickness respectively, of the film. Since the density of the film and membrane are generally known, this equation allows calculation of stress once the resonant frequency and film thickness are measured.

Ku and coworkers, used a commercially available optical distance measuring device to monitor diaphragm position. Movement of the diaphragm was induced by electrostatic forces applied to the diaphragm from an electronic oscillator-driven capacitively coupled electrode. The oscillator frequency was slowly swept to allow location of the diaphragm mechanical resonance and from this value, the stress was determined.

SUMMARY OF THE INVENTION

It has been found that frequent and rapid measurement of stress is required to allow adjustments in a tungsten deposition system so that stress in the deposited tungsten is meaningfully reduced. Resonant frequency determinations allowing such adjustment at least 6 times per minute, are required to significantly improve stress characteristics. This measurement performance is advantageously achieved in a resonant frequency technique by employing a single electrode monitoring system. This system capacitively drives the diaphragm and simultaneously determines its frequency by maintaining it in mechanical oscillation at its resonant frequency. Use of a single multi-function electrode in this way is quite difficult since the system must exhibit negligible crosstalk between the measuring and driving functions. The system must also be immune to the very high power rf frequency typically employed in the sputtering deposition procedure itself. Further, the capacitance from the backplate to the diaphragm is quite small i.e. less than 20 pF, while associated parallel stray capacitances to ground are generally significantly larger, compounding the difficulties.

These problems are overcome, and rapid measurement is achieved, utilizing the apparatus shown schematically in FIG. 1. A bifilar transformer (1), high voltage emitter follower 2, and shielded cable 3 are employed both to avoid these various problems and to maintain the diaphragm in continuous oscillation. Additionally, since the diaphragm is maintained at its resonant frequency, even though the film thickness is continuously changing, continuous determinations of stress are available. In this manner stress is reducible by adjusting process parameters, such as sputtering gas pressure and/or rf power, in response to the stress measurements.

DETAILED DESCRIPTION

Figure 1:
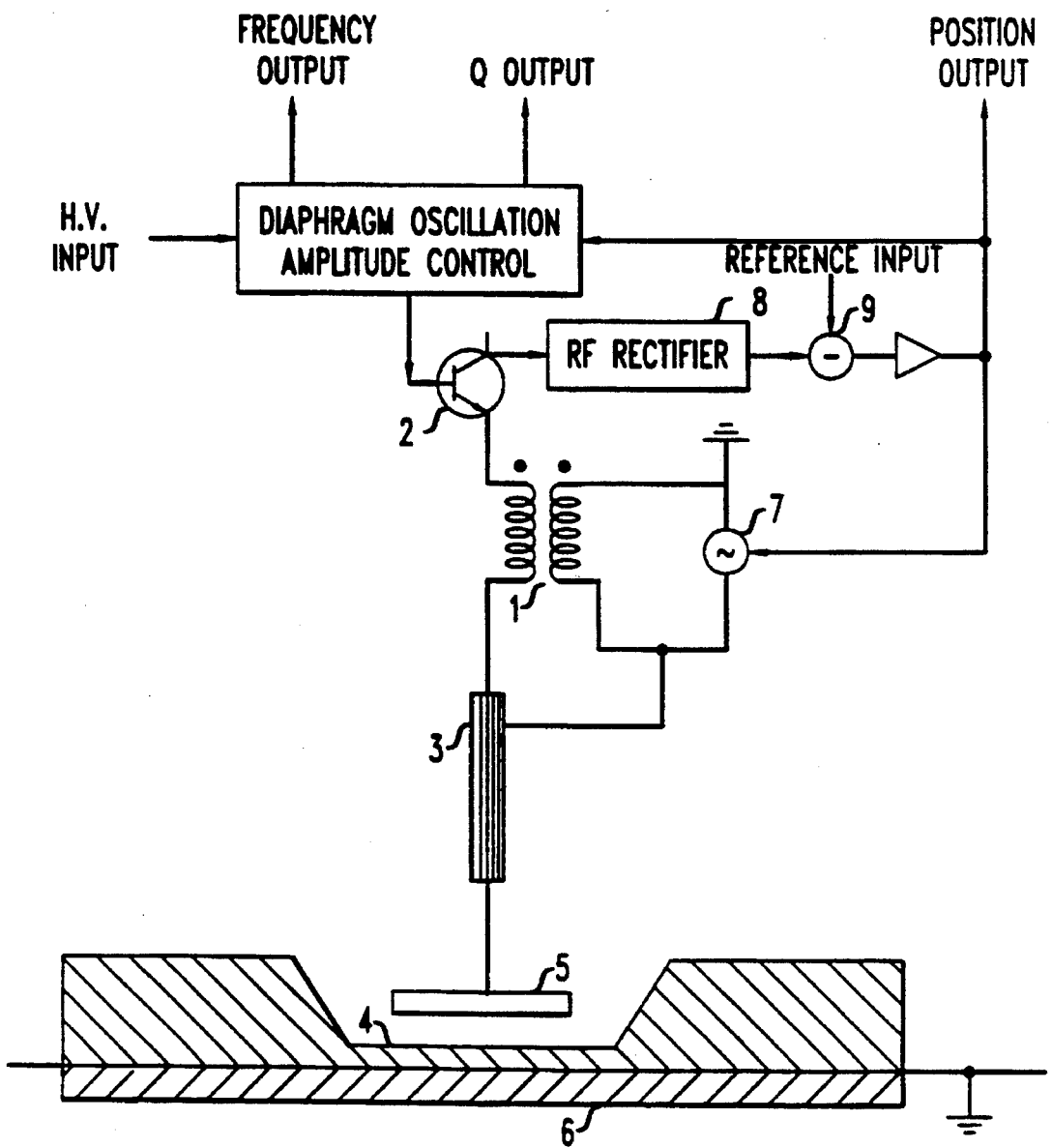
FIG. 1 is a schematic representation of an apparatus for measuring stress in a growing tungsten film.

As discussed, the invention involves the realization that to control stress during deposition of metals on a membrane, it is necessary to frequently measure this stress during deposition and adjust accordingly. Typically, for membranes having thicknesses in the range 0.1 to 4 μm formed of materials such as Si and $SiN_x$ and with deposits of metals such as tungsten, at least 6 measurements per minute should be made. Stress in the evolving metal film is then adjusted by correcting parameters such as sputtering gas pressure and/or rf power. The total stress depends on these parameters in a complicated manner, but typically compressive stress decreases with an increase in sputtering gas pressure or with a corresponding decrease in rf power.

Although the particular method employed to obtain the necessary measurement of stress is not critical, previous techniques (involving relatively slow frequency scanning to establish a membrane resonant frequency) are clearly inadequate. By contrast it has been found that a technique which maintains the membrane at its resonant frequency while utilizing a single driving and measuring electrode, is particularly advantageous in this regard.

In the one-electrode technique, the capacitance between the membrane 4 and the electrode 5 is measured and electronically processed in such a way that the output is a linear function of the distance between the electrode and the membrane. (See G. L. Miller U.S. Pat. No. 4,893,071, dated Jan. 9, 1990, (which is hereby incorporated by reference) and especially FIGS. 8 and 9 with accompanying text in column 6, line 46, to column 7, line 60.) From this measurement, a voltage is made available which indicates the position of the membrane, i.e. its distance from the backplate. This voltage is then suitably added to a large, fixed, high voltage (typically approximately 150 volts) and applied back to the electrode 5 via the emitter follower 2 and transformer 1. The operation of this whole loop is such as to continuously maintain the diaphragm in mechanical oscillation at its resonant frequency. Measurement of that frequency, coupled with the use of Equation 1, allows the stress to be determined.

A system for achieving this result is shown in FIG. 1. The diaphragm 4 with its metal layer 6 being deposited, is shown relative to an electrode 5. This electrode is driven by an rf oscillator 7 through a bifilar, one-to-one transformer 1. The rf output of the oscillator is coupled through this transformer to the electrode and is also imposed on a driven shield 3. Since the shield and the lead to the electrode are maintained at the same RF potential, no error due to capacitance between the shield and the center lead of the cable is introduced.

The capacitive measurement of distance using a feedback loop through an rf rectifier 8, and comparison to a reference input 9, has been discussed in U.S. Pat. No. 4,893,071, dated Jan. 9, 1990, which is hereby incorporated by reference (with particular reference to FIGS. 8 and 9). Additionally, related distance measurements based on capacitance have also been discussed in a publication by G. L. Miller in *IEEE Transactions on Electron Devices*, ED-19, pages 1103–1108, October, 1972.

The disc electrode 5 is driven with RF (typically approximately 1 V p—p at 3 MHz) via a toroidal bifilar transformer 1. The far end of the secondary of this transformer is connected to the emitter of a high voltage transistor emitter follower 2 (all power supply and biasing arrangements have been omitted for clarity). Essentially all of the RF 3 MHz displacement current flowing from the disc 5 to the diaphragm 4 therefore flows out of the collector of 2. (Note that the lead to the disc itself is provided with an accurately driven shield 3 to remove the dead capacitance effect.)

The RF current from the emitter follower 2 collector passes through a tuned amplifier (not shown) to a rectifier, the output of which is therefore a measure of the disc to diaphragm spacing. The rectifier output is then compared with a constant (demanded) value 9 and the error signal between the two is used in turn to servo the oscillator 7 (typically 3 MHz) amplitude. In this way the oscillator 7 amplitude itself is accurately and linearly proportional to the position of the diaphragm, i.e. is a linear measure of the spacing from the diaphragm 4 to the backplate 5. This is necessarily so since the operation of this whole electronic loop is such, in effect, as to force a constant magnitude of RF displacement current through the capacitor formed by the backplate 5 and the membrane 4. The system output voltage is simply a linear measure of the magnitude of the RF voltage needed to achieve this end. As such it is proportional to the spacing between the diaphragm and the backplate.

Given such a position signal it is then only necessary to appropriately feed it back as a DC level through emitter follower 2 to cause the diaphragm to constantly oscillate at its resonant frequency. As a pedagogic aid it is possible to visualize this process physically. As long as the diaphragm is moving towards the backplate the DC voltage across the gap is increased above its static value of approximately 150 volts. While the diaphragm is moving away from the backplate the voltage is correspondingly decreased. The associated electrostatic forces cause the diaphragm to oscillate at its resonant frequency. A separate loop stabilizes the magnitude of the diaphragm oscillatory motion by servoing the feedback voltage amplitude. This subsidiary loop also provides damping, or Q, information.

It is desirable to maintain the stress level at a relatively low value, e.g. below 50 MPa, preferably below 10 MPa. Thus, the deposition process parameters as previously discussed are adjusted until the output indicates an appropriate reduction in stress level.

The following example is illustrative of the techniques involved in the invention.

EXAMPLE 1

A 1 μm silicon membrane having a stress of approximately 100 MPa was prepared as described in L. E. Trimble et al., *SPIE*, Vol. 1263, "Electron Beam, X-Ray, and Ion-Beam Technology: Submicrometer Lithographies IX" (1990), pp. 251–258. This membrane was placed on the sample holder of a conventional sputtering apparatus described in concurrently filed U.S. patent application Ser. No. 07/850,637, pending. The apparatus was configured such that the gap between the measurement electrode (approximately 2 cm diameter) and the membrane was 250 μm. (The measuring circuitry was, as shown in FIG. 1.) The chamber was evacuated to a base pressure of approximately $1\times10^{-7}$ Torr. An argon gas flow rate was established to maintain the chamber pressure at approximately 20 mTorr. (This pressure was chosen to be near the compressive to tensile transition pressure of 18 mTorr so that adjustments necessarily performed during deposition would not be excessively large. The determination of this transition pressure was done as described by R. R. Kola et al, in *Journal of Vacuum Science and Technology*, B9, page 3301 (1991).)

Figure 2:
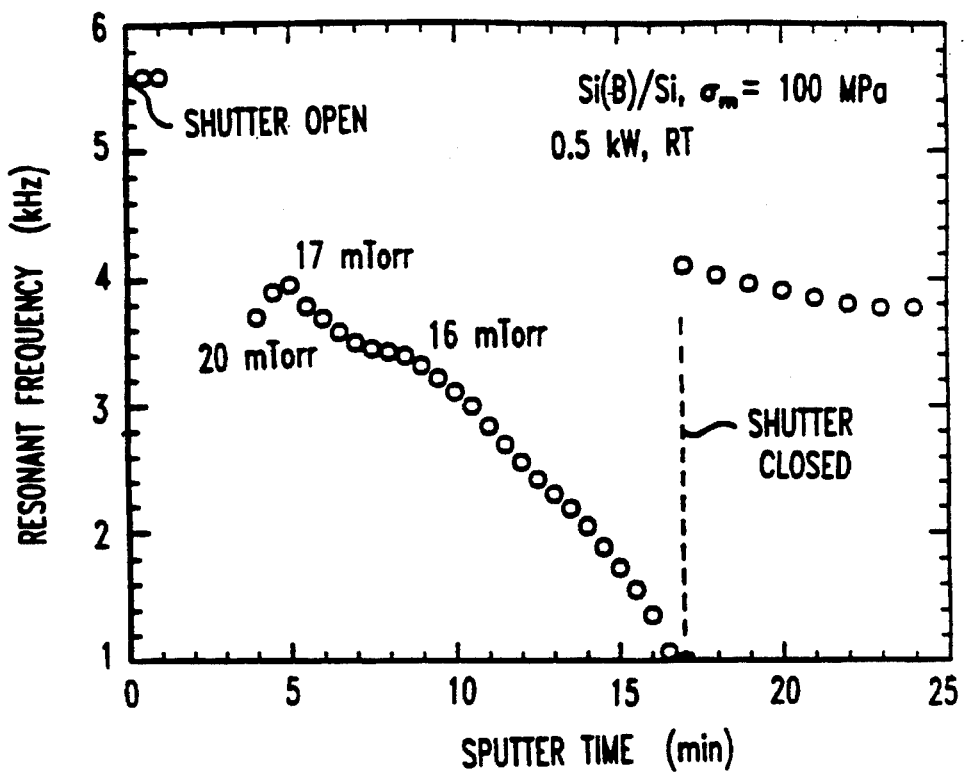
FIG. 2 is a plot of resonant frequency vs. sputter time for various pressure levels during sputtering of a tungsten film.

A plasma was struck in the argon at 13.56 MHz with a power density of 1.6 W/cm² to induce sputtering from an 8 inch tungsten target having a purity of 99.999%. After approximately 5 minutes, a shutter positioned between the target and the sample was opened. The resonant frequency, as determined from the measured voltage from the electronic circuitry and Equation 1, immediately dropped by about 2.5 KHz due to the temperature difference between the thin membrane and the thick silicon substrate. The temperature equilibrated in approximately 5 minutes. (This frequency drop in equilibration is shown in FIG. 2 in the left hand portion of the curve. Measurements were delayed slightly from initial shutter opening in this Example to allow the membrane to come into tensile stress and, thus, to avoid any possibility of membrane fracture.) The resonant frequency was then continuously monitored and the pressure adjusted so that this measured resonant frequency followed, as the deposited thickness increased, the frequency trend predicted by Equation 1 for zero stress.

Figure 3:
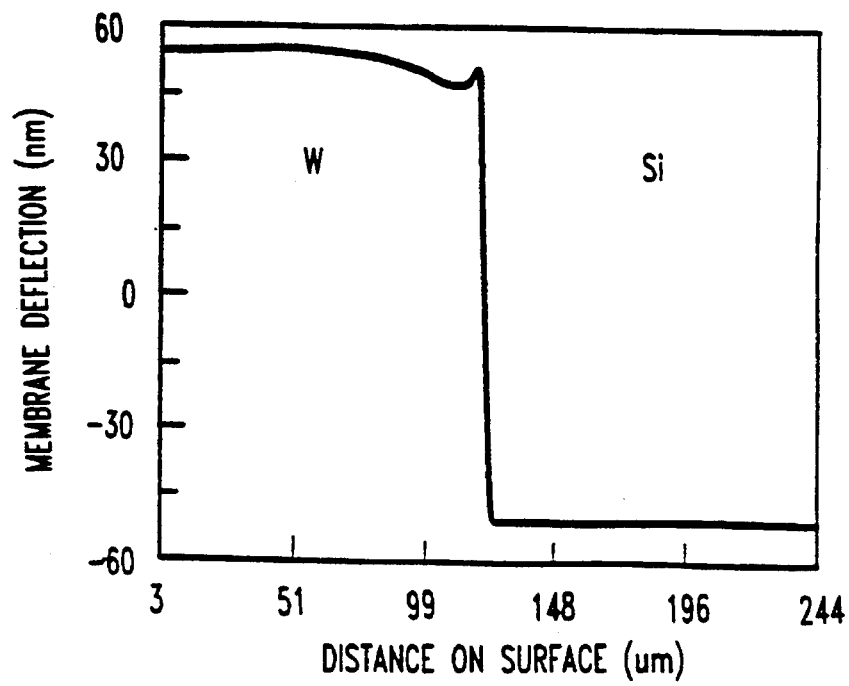
FIG. 3 is a plot of membrane deflection at the edge of a tungsten film.

The predicted resonant frequency in Equation 1, however, does not provide for temperature effects. To correct for temperature effects, the resonant frequency of the composite membrane for the final desired deposited thickness was empirically determined under identical deposition conditions using a series of control samples. In these samples, the deposition procedure described in this example was followed to the final deposited thickness of 0.5 μm. The deposited tungsten was removed from half the membrane, and the membrane deflection at the resulting tungsten edge was measured using a WYKO optical interferometer. The final resonant frequency of the sample showing zero deflection (as shown in FIG. 3) for this interferometric measurement is the temperature corrected, zero stress frequency. The determined zero stress resonant frequency, under the conditions employed, was 3.85 KHz.

Adjustments during deposition were continued so that at the final thickness, the resonant frequency measured 1.1 KHz. (The resonant frequency during the run as a result of pressure adjustments to control stress is shown in FIG. 2.) The shutter was then closed, inducing the resonant frequency to increase by about 2.7 KHz since the membrane cooled substantially faster than the substrate. (This increase was compensated for so that the final room temperature frequency of the membrane was 3.85 KHz.) The sample was then allowed to cool in flowing argon for approximately 10 minutes. The sample was evaluated by removing the tungsten film from half the wafer. Straight interference fringes across the resulting tungsten edge indicated a stress very close to zero.

The same procedure was repeated for a silicon nitride membrane on a silicon substrate and a silicon nitride membrane on a glass substrate. In each case, final tungsten stresses below 10 MPa were achieved.

We claim:

1. An apparatus, comprising:

a source that is operable to deposit a film on a substrate; and a system for rapidly measuring the resonant frequency of the substrate having the film growing thereon, the system comprising a single electrode and a positioner operable to place the substrate opposite the electrode, an oscillation controller for imposing an oscillating s signal on the electrode, a capacitive detector that measures the distance between the electrode and the substrate in a first feedback loop, and a second feedback loop responsive to the capacitive detector and cooperating with the oscillation controller to maintain the substrate with the film growing thereon at its resonant frequency.

2. The apparatus of claim 1 further comprising means for adjusting a deposition process parameter in response to a measurement made by said system for rapidly measuring the resonant frequency of a substrate having a film growing thereon.

3. An r.f. sputtering apparatus, comprising:

a source that is operable to deposit a film on a substrate; and a system for rapidly measuring the resonant frequency of the substrate having the film growing thereon, the system comprising a single electrode and a positioner operable to place the substrate opposite the electrode, an oscillation controller for imposing an oscillating signal on the electrode, a capacitive detector that measures the distance between the electrode and the substrate in a first feedback loop, and a second feedback loop responsive to the capacitive detector and cooperating with the oscillation controller for oscillating the electrode to maintain the substrate with the film growing thereon at its resonant frequency.

4. The r.f. sputtering apparatus of claim 3 further comprising means for adjusting a deposition process parameter in response to a measurement made by said system for rapidly measuring the resonant frequency of a substrate having a film growing thereon.

\* \* \* \* \*